United States Patent

De Puy

[15] 3,659,216

[45] Apr. 25, 1972

[54] LINEAR MAGNETIC AMPLIFIER

[72] Inventor: Robert P. De Puy, Cherry Hill, N.J.

[73] Assignee: General Electric Company

[22] Filed: Sept. 28, 1970

[21] Appl. No.: 75,808

[52] U.S. Cl. .......................................330/8, 330/24, 330/40
[51] Int. Cl. ..........................................................H03f 9/00
[58] Field of Search ......................................................330/8

[56] References Cited

UNITED STATES PATENTS

| | | | |
|---|---|---|---|
| 3,469,179 | 9/1969 | Bassett, Jr. | 330/8 X |
| 2,965,835 | 12/1960 | Gilson | 330/8 X |

*Primary Examiner*—Nathan Kaufman
*Attorney*—J. Wesley Haubner, Barry A. Stein, Frank L. Neuhauser, Oscar B. Waddell and Joseph B. Forman

[57] ABSTRACT

Disclosed is a 2 stage linear magnetic amplifier. The first stage includes a pair of saturable magnetic cores each having a control and a gate winding thereon. Excitation voltage is provided to respective first stage gate windings by an alternating voltage source. A DC control voltage is provided to energize the respective control windings via a synchronous switch to reset them in synchronism with the alternating voltage. The second stage includes a pair of saturable magnetic cores each having a control and a gate winding thereon. Respective second stage control windings are connected in series with respective first stage gate windings so that the output from the first stage gate windings provides reset for the second stage. The respective second stage gate windings are connected to the alternating source and the load.

4 Claims, 2 Drawing Figures

INVENTOR:
ROBERT P. DEPUY
BY Barry A. Stein
ATTORNEY

INVENTOR:
ROBERT P. DEPUY,
BY Barry A. Stein
ATTORNEY

LINEAR MAGNETIC AMPLIFIER

BACKGROUND AND OBJECTS OF THE INVENTION

This invention relates in general to magnetic amplifiers and in particular to magnetic amplifier circuits which provide high gain with a substantially linear output characteristic.

Magnetic amplifiers have found widespread use in electrical systems requiring relatively large power gains and isolation between the control circuitry and the output or load circuitry. For example, in high power distribution systems large magnetic amplifiers or amplistats are commonly used for varying or regulating the magnitude of large amounts of power. It is sometimes desirable to control such amplifiers from low power electronic circuits, e.g., integrated circuit operational amplifiers. Since the control voltage and power required by the power amplistat may be several orders of magnitude higher than the signal provided by the integrated circuit, amplifying means is needed for coupling the latter to the former. A low excitation current magnetic amplifier having a high gain is particularly well suited to form this interface.

It is therefore an object of this invention to provide an improved low input-high gain, magnetic amplifier.

As with any type of amplifier, linearity of response is a desired magnetic amplifier design objective. Heretofore feedback schemes have been utilized to achieve some semblance of linearity, but such schemes have not always performed satisfactorily and are often complex and unwieldly.

It is therefore a further object of this invention to provide a novel magnetic amplifier exhibiting a linear output characteristic substantially independent of variations in the line voltage of the energy source from which the output is derived.

SUMMARY OF THE INVENTION

A two stage magnetic amplifier is provided for amplifying a low value DC voltage and current. Power is provided by an alternating voltage supply. The amplifier exhibits a linear response irrespective of variations in the amplitude of the alternating voltage.

The first stage of the amplifier includes a pair of saturable core reactors each having a control and a gate winding thereon. The gate winding on one reactor is coupled to the alternating voltage supply for energization during one half cycle of the alternating voltage. The gate winding of the other first stage reactor is coupled to the same supply for energization during the alternate half cycle of the alternating voltage. A synchronous switch is provided to allow the direct voltage to energize respective control windings of the first stage reactors during the half cycles their respective gate windings are not energized.

The second stage of the amplifier includes a pair of saturable cores each having a control and a gate winding thereon. Each of the control windings is connected in series with a respective gate winding of the first stage. The gate windings of the second stage are coupled to the source of alternating voltage and a load and are adapted so that one gate winding is energized during one half cycle of the alternating voltage and the other gate winding is energized during the alternate half cycle.

When connected in the above described manner the direct voltage induces a quantity of volt-seconds per turn in the first stage cores to effect reset therein during respective half cycles. During the alternate half cycles the alternating voltage supplied to the gate windings causes the cores to saturate when they have been excited by the same number of volt-seconds per turn which was provided during the reset half cycle. When the respective first stage cores saturate, the alternating voltage is switched to the serially connected control winding of the second stage. The amount of volt-seconds supplied to these windings effects reset of the second stage cores. Therefore, the degree to which the cores are reset is determined by the difference between the average value of the alternating exciting voltage and the DC voltage. Upon their energization by the alternating voltage, the respective second stage gate windings stand off enough voltage to equal the amount of volt-seconds per turn applied to their respective control windings. When this value is reached the respective second stage cores saturate and the alternating voltage is rectified and passed on to the load.

BRIEF DESCRIPTION OF THE DRAWINGS

This invention will be better understood and its various objects and advantages will be more fully appreciated from the following description taken in conjunction with the accompanying drawings in which.

DESCRIPTION OF THE PREFERRED EMBODIMENT

Figure 1:
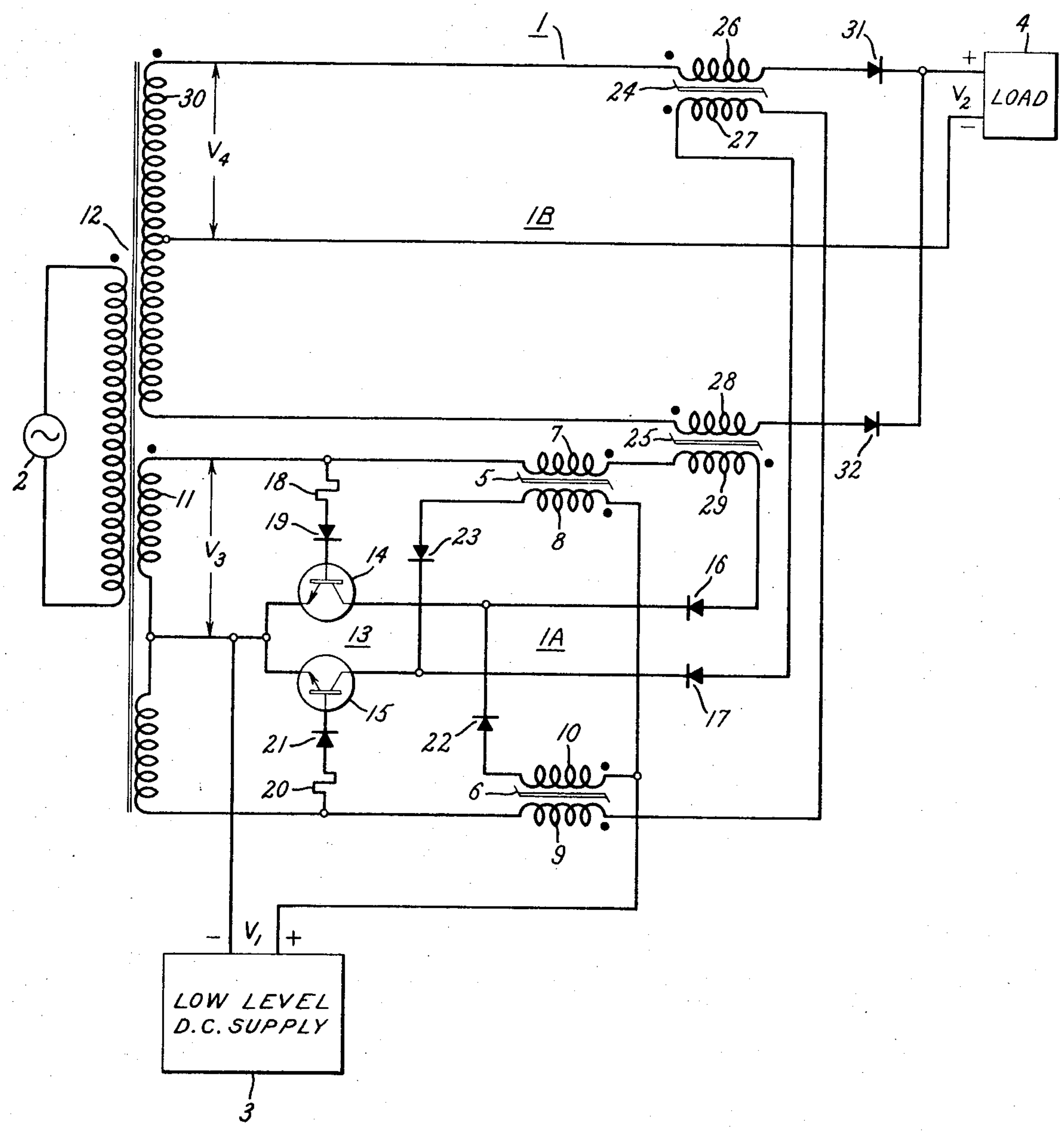
FIG. 1 is a schematic circuit diagram of my linear magnetic amplifier.

FIG. 1 shows, in schematic diagram form, a magnetic amplifier 1 having two stages 1A and 1B. Amplifier 1 is connected to a supply 2 of alternating voltage to provide the power therefor. The input or control voltage $V_1$ to the amplifier is provided by a variable magnitude low level DC supply 3. The output of the amplifier is fed to a load 4.

The first stage 1A of the amplifier comprises a pair of saturable magnetic cores 5 and 6, each having a gate and a control winding thereon. Gate winding 7 and control winding 8 each have the same number of turns. They are disposed about core 5 and are arranged with their polarities shown by the conventional dot notation. Similarly gate winding 9 and control winding 10 have the same number of turns and are disposed about core 6. Gate winding 7 and gate winding 9 are connected to respective ends of the center tapped secondary 11 of transformer 12 (the polarity of the transformer windings is also shown by conventional dot notation).

Secondary 11 is provided to supply an alternating excitation or energization voltage $V_3$ to the respective first stage gate windings during respective half cycles of the alternating voltage from supply 2.

Energization of the control windings 8 and 10 is accomplished from the low level DC control supply 3 via a synchronous switch 13. Switch 13 comprises two semiconductor switches or transistors, 14 and 15. Transistor 14 is adapted, when conductive, to supply the DC control voltage $V_1$ to control winding 10. Transistor 15, is adapted, when conductive to similarly supply $V_1$ to control winding 8. In order to provide the means to bias these transistors into conduction I have connected the base of transistor 14 to the dotted end of secondary 11 via current limiting resistor 18 and polarity insuring diode 19 and have connected the base of transistor 15 to the undotted end of secondary 11 via current limiting resistor 20 and polarity insuring diode 21. During half cycles when the dotted end of secondary 11 is positive transistor 14 is rendered conductive by the flow of bias current to its base. During alternate half cycles transistor 15 is rendered conductive by the flow of bias current to its base. Diode 22 is provided to insure that control winding 10 can only be energized in one direction. Similarly, diode 23 is provided to ensure that control winding 8 can only be energized in one direction.

Energization of a cores' control winding effects magnetization therein. This magnetization or "resetting" of the core is the volt-seconds/turn impressed upon the control winding during its energization.

The magnitude of supply voltage $V_1$ is chosen to be insufficient to cause saturation in the first stage cores during energization of their respective control windings.

Synchronous switch 13 and polarity controlling diodes 16 and 17 are provided as means for allowing the first stage gate windings to be energized by the alternating voltage $V_3$ when polarity is proper. For example, during the alternating voltage half cycle when the dotted end of secondary 11 is positive, the positive half cycle of voltage $V_3$ is impressed upon gate winding 7 via forward biased diode 16 and conducting transistor 14. When the undotted end of secondary 11 is positive, the alternate or negative half cycle of $V_3$ is impressed upon gate winding 9 via forward biased diode 17 and conducting transistor 15.

Alternating voltage $V_3$ is chosen to be of sufficient magnitude to cause the cores to saturate within a half cycle of excitation voltage. Nevertheless, core saturation cannot occur, upon the application of $V_3$ to the respective gate windings until the gate windings have applied thereto the same amount of volt-seconds/turn which was applied by DC supply voltage $V_1$. Once this occurs the respective cores saturate.

The second stage, 1B, of amplifier 1 comprises a pair of saturable magnetic cores 24 and 25 each having a gate winding and a control winding thereon. Gate winding 26 and control winding 27 are disposed about core 24 with their polarities as shown by conventional dot notation. Gate winding 28 and control winding 29 are disposed about core 25 with the polarities similarly shown. Gate winding 26 and 28 are connected to respective ends of center tapped secondary 30. This secondary is provided to supply alternating excitation voltage $V_4$ to gate windings 26 and 28 during respective half cycles of the alternating voltage from source 2. Gate winding 26 is connected to the anode of diode 31 while gate winding 28 is connected to the anode of diode 32. The cathodes of diode 31 and 32 are connected to one side of load 4 and the other side of the load is connected to the centertap of secondary 30.

The time during respective half cycles of alternating voltage $V_4$ that respective cores 24 and 25 saturate is determined by the amount of reset volt-seconds/turn applied to their respective control windings. As can be seen control winding 27 is connected in series with gate winding 9 while control winding 29 is connected in series with gate winding 7. Therefore when core 5 saturates, the alternating voltage $V_3$ is transferred to control winding 29 to provide for reset core 25. Similarly when core 6 saturates (i.e., during alternate half cycles of $V_3$) the alternating voltage $V_3$ is transferred to control winding 27 to provide reset for core 24. Voltage $V_3$ first appears on gate windings 7 or 9 and then switches to respective control windings 29 or 27 because the excitation current required for windings 27 or 29 is high compared to windings 7 or 9.

Since the point in the half cycle that core 5 saturates is dependent upon the amount of reset volt-seconds/turn provided by the DC control supply, the degree to which core 25 is reset is a function of the difference between the average value ($V_{3ave}$) of the energization voltage $V_3$ and DC control voltage $V_1$. Similarly, the amount of reset of core 24 is a function of the difference between the average value energization voltage $V_3$ and DC voltage $V_1$. Once the amount of reset volt-seconds/turn provided to the second stage cores is overcome by the excitation of their respective gate windings the second stage cores saturate and the alternating excitation voltage $V_4$ is passed to the load as output voltage $V_2$. Therefore, the output voltage can be seen to be equal to the difference between the average value ($V_{4ave}$) of the excitation voltage $V_4$ and the second stage reset voltage, the latter in turn being equal to the difference between $V_{3ave}$ and reset or control voltage $V_1$. As will be shown later the output voltage $V_2$ is a linear function of the input voltage $V_1$ and is independent of variations in the alternating voltage from source 2.

Figure 2:
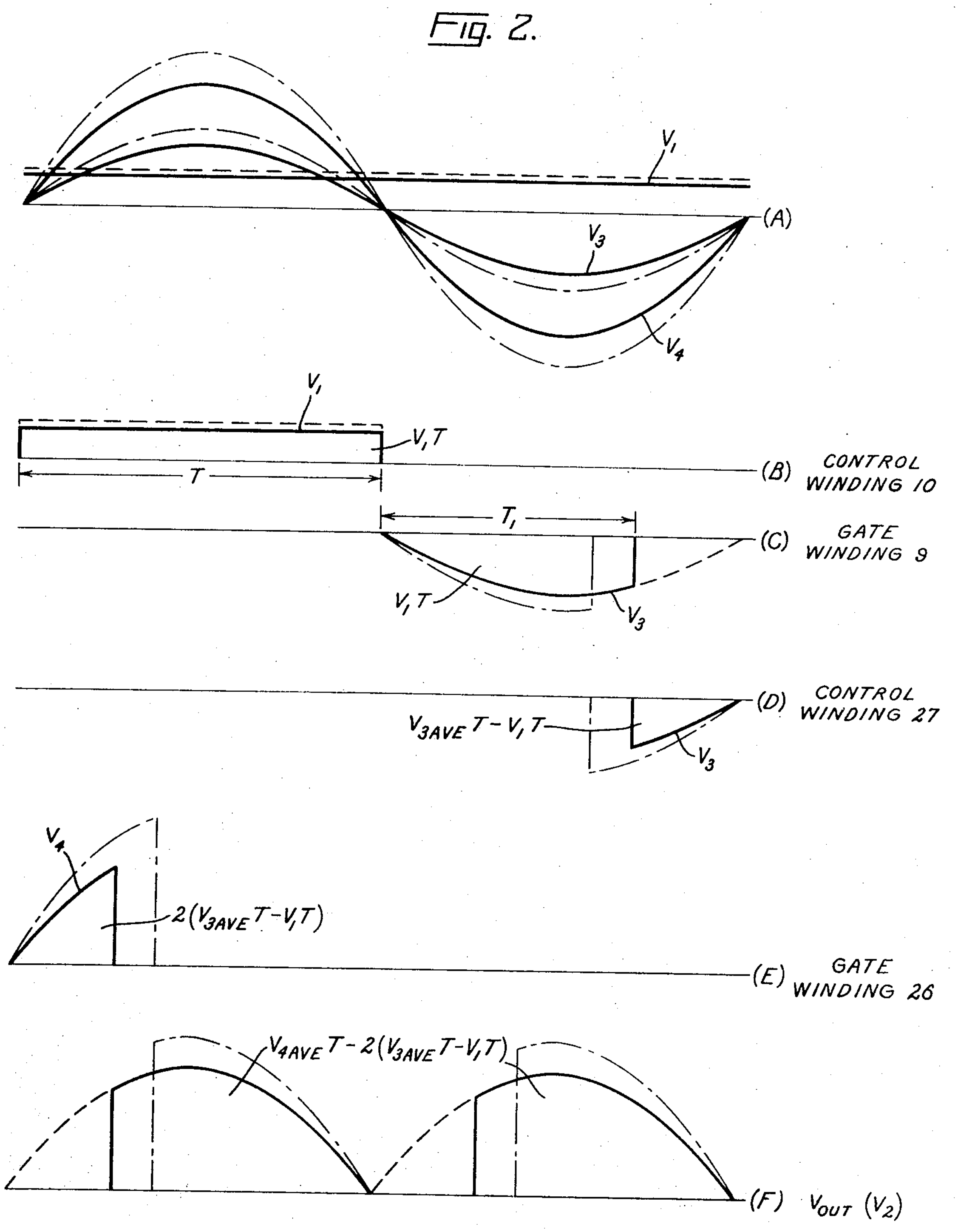
FIG. 2 is a graphical representation of the operation of the amplifier shown in FIG. 1.

Operation of the amplifier will be better understood from the following discussion and reference to the schematic diagram of FIG. 1 and the graphs of FIG. 2. Graph A represents exemplary traces of $V_3$ and $V_4$ chosen for ease of explanation. In that graph $V_4$ is shown as being twice the value of $V_3$. It should be appreciated that $V_3$ and $V_4$ are in phase with each other since they both are provided by alternating voltage source 2 via transformer 12. DC control voltage $V_1$ is shown as being one half the peak value of $V_3$.

At the beginning of the positive half cycle of $V_3$ (i.e., when the dotted end of secondary 11 is positive) base current is enabled to flow into transistor 14 via resistor 18 and diode 19, thereby rendering transistor 14 conductive. As transistor 14 conducts, control winding 10 is energized by the low level d.c. voltage $V_1$ (shown in graph B). This energization continues for the entire time that transistor 14 conducts (i.e., the entire half cycle) to apply $V_1T$ volt-seconds/turn reset magnetization to core 6 (where T is the time duration, in seconds, of one half cycle of $V_3$).

At the termination of the positive half cycle of $V_3$ transistor 14 ceases conducting and accordingly further resetting of core 6 ceases. At the beginning of the alternate or negative half cycle of $V_3$ (i.e., when the undotted end of secondary 11 is positive) transistor 15 begins conducting due to the flow of current to its base via resistor 20 and diode 21. This results in resetting core 5 by $V_1T$ volt seconds (not shown graphically). Further, the negative half cycle of $V_3$ is applied to gate winding 9 via forward biased diode 17 and conducting transistor 15. Gate winding 9 stands off this impressed voltage (see graph C) until core 6 saturates at which time the voltage is transferred to serially connected control winding 27 (see graph D). As should be appreciated, core 6, having been reset by $V_1T$ volt-seconds/turn during the immediately preceding positive $V_3$ half cycle, cannot saturate during the negative half cycle until gate winding 9 is energized by an equivalent amount of volt-seconds/turn. Therefore core 6 will saturate at time $T_1$, when the equivalent of $V_1T$ volt-seconds/turn is applied to gate winding 9. At the end of $T_1$, when the core saturates, the reamining portion of the negative half cycle of $V_3$ is transferred to control winding 27 to reset core 24. Since $V_3$ is capable of applying $V_{3ave}$ volt-seconds/turn to winding 9, assuming that core 6 has been reset by $V_1T$, the quantity $V_{3ave}T-V_1T$ volt-seconds/turn will be transferred to control winding 27, to reset core 24, when core 6 saturates.

In order to have full range control over amplifier 1 the ratio of the second stage gate winding turns to the control winding turns must be the same ratio as $V_4$ is to $V_3$. In the example being described, gate windings 26 and 28 have twice the number of turns as control windings 27 and 29 since $V_4$ is equal to $2V_3$.

Since the amount of reset applied to control winding 27 is equal to $V_{3ave}T-V_1T$ volt-seconds/turn and since gate winding 26 has twice the number of turns as control winding 27, the total amount of volt-seconds which voltage $V_4$ must apply to winding 26 to cause core 24 to saturate is equal to twice the total number of volt-seconds applied during reset, i.e., 2 ($V_{3ave}T$—by1T).

During the positive half cycle of $V_4$ (when the dotted end of secondary 30 is positive) gate winding 26 will stand off $V_4$ until core 24 saturates, at which time the remaining portion of the positive $V_4$ half cycle will be passed to the load via forward biased diode 31. Therefore, when 2 ($V_{3ave}T-V_1T$) volt-seconds are applied to gate winding 26 by excitation voltage $V_4$, core 24 will saturate and apply the remaining portion of the positive $V_4$ half cycle to the load.

Since $V_4$ is capable of applying $V_{4ave}T$ volt-seconds to gate winding 26, assuming that core 24 has been reset by $2(V_{3ave}T-{}_1T)$, the quantity $V_{4ave}T-2\ (V_{3ave}T-V_1T)$ volt-seconds will be applied to the load, via forward biased diode 31, when core 24 saturates. This quantity is the volt-second output per excitation voltage half cycle of magnetic amplifier 1. Since $V_{4ave}= 2V_{3ave}$, this volt-second output would equal $2V_{3ave}T-2V_{3ave}T+2V_1T$ or $2V_1T$. Stated another way: the average value of the output voltage ($V_{2ave}$) is equal to twice the input voltage ($V_1$). Therefore, it should be appreciated that the output voltage is a linear function of the input voltage and is independent of variations in the excitation or energizing voltage $V_3$ and $V_4$.

The insensitivity of my amplifier to variations in $V_3$ and $V_4$ is shown graphically by the broken line curves in graphs (A)-(F). As shown therein a 25 per cent increase in $V_3$ and $V_4$ results in core 6 saturating earlier in the negative $V_3$ half cycle. The number of volt-seconds per turn applied to reset core 24 is also proportionately greater. But since the quantity of volt-seconds excitation necessary to drive core 24 into saturation is also correspondingly greater, the average value of the output voltage is still twice the value of the input voltage.

The dotted line curve of $V_1$ depicts the condition wherein $V_1$ is equal to $V_{3ave}$. In such a situation core 6 will be fully reset and thus will not saturate during the negative $V_3$ half cycle. Therefore no reset volt-seconds would be applied to control winding 27 and accordingly core 24 would saturate immediately upon the beginning of the positive $V_4$ half cycle. The output voltage would therefore necessarily be $V_{4ave}$.

In any event it should be apparent that the resetting and excitation functions heretofore particularly described with reference to cores 6 and 24 also occur during opposite half cycles in cores 5 and 25, so that the output is a full wave rectified signal (shown in graph F).

Increasing the ratio of $V_4$ to $V_3$ and correspondingly increasing the second stage gate winding-to-control winding turns ratio will increase the voltage amplification factor. Similarly, providing the first stage of the amplifier with control windings having less number of turns than the gate windings will also increase voltage a amplification.

While I have shown and described a particular embodiment of my invention, it will be obvious to those skilled in the art that various changes and modifications may be made without departing from my invention in its broader aspects; and I, therefore, intend in the appended claims to cover all such changes and modifications as fall within the true spirit and scope of my invention.

What I claim and desire to secure by Letters Patent of the United States is:

1. A two-stage magnetic amplifier comprising:

a. a transformer coupled to a source of alternating voltage and including plural secondary windings;

b. a first stage comprising:

i. a first of said secondary windings; and ii. a first saturable magnetic core having first and second windings disposed thereon;

c. a second stage comprising:

i. a second of said secondary windings; and ii. a second saturable magnetic core having third and fourth windings disposed thereon;

d. first means including unidirectional conducting means connecting said first and fourth windings in series with one another and across said first secondary winding, said first means enabling said first and fourth windings to be energized by the voltage appearing on the first secondary winding during one half cycle of the alternating voltage;

e. second means including unidirectional conducting means connecting said third winding in series with said second secondary winding and a load, said second means enabling said third winding to be energized by the voltage appearing on the second secondary winding during the alternate half cycle of the alternating voltage; and f. third means applying direct voltage to said second winding, said third means including:

i. switch means, operative in synchronism with the alternating voltage, enabling the second winding to be energized by the direct voltage during the alternate half cycle of the alternating voltage.

2. The magnetic amplifier as specified in claim 1 wherein said switch means comprises a semiconductor element which is conductive for substantially all of said alternate half cycle.

3. The magnetic amplifier as specified in claim 1 wherein the ratio of the voltage appearing on the second secondary winding with respect to the voltage appearing on the first secondary winding is approximately the same as the ratio of the number of turns of the third winding with respect to the number of turns of the fourth winding.

4. The magnetic amplifier as specified in claim 1 wherein said first stage additionally comprises:

iii. a third of said secondary windings; and iv. a third saturable magnetic core having fifth and sixth windings thereon; and wherein said second stage additionally comprises:

iii. a fourth of said secondary windings; and iv. a fourth saturable magnetic core having seventh and eight windings thereon; and wherein the first means also includes unidirectional conducting means connecting said fifth and eighth windings in series with one another and across said third secondary winding, said first means enabling said fifth and eighth windings to be energized by the voltage appearing on the third secondary winding during said alternate half cycle of the alternating voltage, and wherein the second means also includes unidirection conducting means connecting said seventh winding in series with said fourth secondary winding and the load, said second means enabling said seventh winding to be energized by the voltage appearing on the fourth secondary winding during said one half cycle of the alternating voltage; and wherein said third means also applies said direct voltage to said sixth winding during said one half cycle of the alternating voltage.

* * * * *